(12) United States Patent
Yao et al.

(10) Patent No.: US 7,459,909 B2
(45) Date of Patent: Dec. 2, 2008

(54) MAGNETIC FIELD GENERATING APPARATUS AND MRI APPARATUS

(75) Inventors: Jiabin Yao, Beijing (CN); Kai Cao, Beijing (CN); Cunli Zhang, Beijing (CN); Shinong Fu, Beijing (CN); Shoei Miyamoto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/871,882

(22) Filed: Oct. 12, 2007

(65) Prior Publication Data

US 2008/0088310 A1    Apr. 17, 2008

(30) Foreign Application Priority Data

Oct. 13, 2006   (CN) .................. 2006 1 0160589

(51) Int. Cl.
*G01V 3/00*   (2006.01)
(52) U.S. Cl. ............................ 324/320; 324/318
(58) Field of Classification Search ......... 324/300–322; 335/296–301, 216

See application file for complete search history.

(56) References Cited

U.S. PATENT DOCUMENTS

| 5,309,106 | A | * | 5/1994 | Miyajima et al. ........... 324/318 |
| 6,794,973 | B1 | | 9/2004 | Aoki et al. |
| 6,831,463 | B1 | * | 12/2004 | Pulyer ...................... 324/319 |
| 6,897,656 | B2 | * | 5/2005 | Goto ........................ 324/320 |
| 6,909,284 | B2 | * | 6/2005 | Pulyer ...................... 324/319 |
| 7,019,609 | B2 | * | 3/2006 | Huang et al. ............... 335/296 |
| 7,034,536 | B2 | | 4/2006 | Higuchi |
| 7,065,860 | B2 | | 6/2006 | Aoki et al. |
| 7,071,694 | B1 | * | 7/2006 | Kruip ....................... 324/323 |
| 7,084,633 | B2 | | 8/2006 | Aoki et al. |
| 7,116,197 | B1 | * | 10/2006 | Danby et al. .............. 335/296 |
| 7,154,272 | B2 | | 12/2006 | Goto et al. |

FOREIGN PATENT DOCUMENTS

JP    2001-070284    3/2001

* cited by examiner

*Primary Examiner*—Brij B Shrivastav
(74) *Attorney, Agent, or Firm*—Armstrong Teasdale LLP

(57) ABSTRACT

To achieve a good balance among the magnetic field intensity, region of homogeneous magnetic field intensity and cost, a magnetic field generating apparatus for generating a magnetic field in a vertical direction comprises: a pair of magnets having respective magnetic poles with mutually opposite polarities disposed to face each other in a vertical direction, for generating a static magnetic field having different dimensions of its region of homogeneous magnetic field intensity in two mutually orthogonal directions in a horizontal plane; a pair of planar magnetic elements, each element supporting respective one of the pair of the magnets; and a vertical columnar magnetic element lying in a direction different from the two directions, each end of which is joined to respective one of the pair of the planar magnetic elements.

20 Claims, 11 Drawing Sheets

(a)

(b)

(a)

(b)

(a)

(b)

MAGNETIC FIELD GENERATING APPARATUS AND MRI APPARATUS

CROSS REFERENCE TO RELATED APPLICATIONS

This application claims the benefit of Chinese Patent Application No. 200610160589.7 filed Oct. 13, 2006.

BACKGROUND OF THE INVENTION

The present invention relates to a magnetic field generating apparatus and an MRI (Magnetic Resonance Imaging) apparatus, and particularly to a magnetic field generating apparatus for generating a magnetic field in a vertical direction, and an MRI apparatus using the magnetic field in the vertical direction.

An MRI apparatus is configured to reconstruct an image based on magnetic resonance signals collected by applying a static magnetic field, a gradient magnetic field, and an RF (radio frequency) magnetic field to a subject. In an MRI apparatus of a vertical magnetic field type, a pair of magnets disposed to face each other in a vertical direction generate a static magnetic field. The static magnetic field is generated such that its region of homogeneous magnetic field intensity has a spherical shape (see Patent Document 1, for example).

[Patent Document 1] Japanese Patent Application Laid Open No. 2001-070284.

Although a static magnetic field desirably has magnetic field intensity as high as possible and a region of homogeneous magnetic field intensity as large as possible, a magnet whose magnetic pole has a large surface area and a commensurately large magnetic circuit are required accordingly, unavoidably leading to increased cost.

SUMMARY OF THE INVENTION

It is therefore an object of the invention to provide a magnetic field generating apparatus capable of achieving a good balance among the magnetic field intensity, region of homogeneous magnetic field intensity and cost, and also provide an MRI apparatus comprising such a magnetic field generating apparatus.

In one aspect of the invention for solving the problem, there is provided a magnetic field generating apparatus for generating a magnetic field in a vertical direction, comprising: a pair of magnets having respective magnetic poles with mutually opposite polarities disposed to face each other in a vertical direction, for generating a static magnetic field having different dimensions of its region of homogeneous magnetic Field intensity in two mutually orthogonal directions in a horizontal plane; a pair of planar magnetic elements, each element supporting respective one of the pair of the magnets; and a vertical columnar magnetic element lying in a direction different from the two directions, each end of which is joined to respective one of the pair of the planar magnetic elements.

In another aspect of the invention for solving the problem, there is provided an MRI apparatus for reconstructing an image based on magnetic resonance signals collected by applying a static magnetic field, a gradient magnetic field, and an RF magnetic field to a subject, comprising: a pair of magnets having respective magnetic poles with mutually opposite polarities disposed to face each other in a vertical direction, for generating a static magnetic field having different dimensions of its region of homogeneous magnetic field intensity in two orthogonal directions in a horizontal plane; a pair of planar magnetic elements, each element supporting respective one of the pair of the magnets; a vertical columnar magnetic element lying in a direction different from the two directions, each end of which is joined to respective one of the pair of the planar magnetic elements; a cradle movable in one axis direction with the subject laid thereon; and a table for supporting the cradle, capable of aligning the direction of its movement axis with any of the two directions.

Preferably, the region of homogeneous magnetic field intensity has a horizontal cross section of an elliptical shape, in that a good balance is obtained between the magnetic field intensity and region of homogeneous magnetic field intensity.

Preferably, a magnetic pole surface of each one of the pair of the magnets has different dimensions in the two directions, in that a magnetic field is provided with a good balance between the magnetic field intensity and region of homogeneous magnetic field intensity.

Preferably, the magnetic pole surfaces of the pair of the magnets have an elliptical shape, in that the region of homogeneous magnetic field intensity has a horizontal cross section of an elliptical shape.

Preferably, the magnetic pole surfaces of the pair of the magnets have a rectangular shape, in that the region of homogeneous magnetic field intensity has a horizontal cross section of an elliptical shape.

Preferably, the number of the columnar magnetic elements is two, in that good support for the planar magnetic elements is obtained.

According to the invention, a magnetic field generating apparatus for generating a magnetic field in a vertical direction comprises a pair of magnets for generating a static magnetic field having different dimensions of its region of homogeneous magnetic field intensity in two mutually orthogonal directions in a horizontal plane, a pair of planar magnetic elements, each element supporting respective one of the pair of the magnets, and a vertical columnar magnetic element lying in a direction different from the two directions, each end of which is joined to respective one of the pair of the planar magnetic elements; thus, there are provided a magnetic field generating apparatus capable of achieving a good balance among the magnetic field intensity, region of homogeneous magnetic field intensity and cost, and an MRI apparatus comprising such a magnetic field generating apparatus.

Further objects and advantages of the present invention will be apparent from the following description of the preferred embodiments of the invention as illustrated in the accompanying drawings.

DETAILED DESCRIPTION OF THE INVENTION

Figure 1:
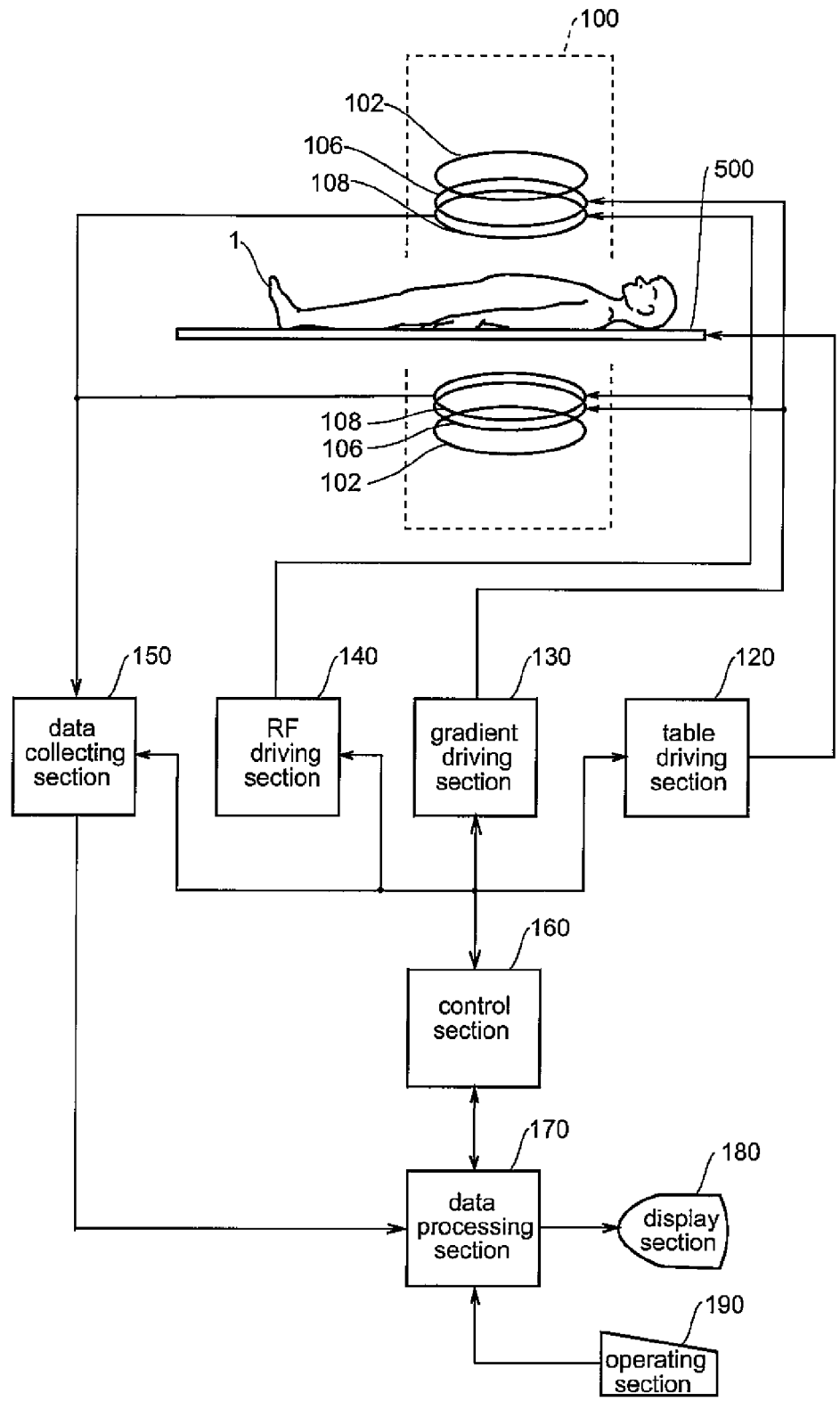
FIG. 1 is a block diagram of an MRI apparatus of an example of the best mode for carrying out the invention.

Now the best mode for carrying out the invention will be described in detail with reference to the accompanying drawings. It should be noted that the invention is not limited to the best mode for carrying out the invention. FIG. 1 shows a block diagram of an MRI apparatus. The apparatus is an example of the best mode for carrying out the invention. The configuration of the apparatus represents an example of the best mode for carrying out the invention of the MRI apparatus.

As shown in FIG. 1, the present apparatus comprises a magnetic field generating apparatus 100. The magnetic field generating apparatus 100 comprises a main magnetic field magnet section 102, a gradient coil section 106 and an RF coil section 108.

The main magnetic field magnet section 102, gradient coil section 106 and RF coil section 108 each comprise a pair of members disposed to face each other across a space between them. They have a generally planar shape and disposed to have a common center axis.

An internal space (bore) of the magnetic field generating apparatus 100 receives a subject 1 laid on a table 500 and carried into/out of the bore. The table 500 is driven by a table drive section 120.

The main magnetic field magnet section 102 generates a static magnetic field in the internal space of the magnetic field generating apparatus 100. The direction of the static magnetic field is generally orthogonal to the body axis direction of the subject 1. That is, what is generally called a "vertical magnetic field" is generated. The main magnetic Field magnet section 102 is made using a magnet. The main magnetic field magnet section 102 will be sometimes referred to as magnet 102 hereinbelow.

The gradient coil section 106 generates three gradient magnetic fields for creating gradients in the static magnetic field intensity in directions along three mutually orthogonal axes, i.e., a slice axis, a phase axis and a frequency axis. The gradient coil section 106 comprises three gradient coils (not shown) corresponding to the three gradient magnetic fields.

The RF coil section 108 transmits an RF pulse (radio frequency pulse) to the static magnetic field space for exciting spins within the subject 1. The RF coil section 108 also receives magnetic resonance signals generated by the excited spins. The RF coil section 108 may comprises a single coil or separate coils for transmission and reception.

The gradient coil section 106 is connected with a gradient drive section 130. The gradient drive section 130 supplies a drive signal to the gradient coil section 106 to generate the gradient magnetic fields. The gradient drive section 130 comprises three drive circuits (not shown) corresponding to the three gradient coils in the gradient coil section 106.

The RF coil section 108 is connected with an RF drive section 140. The RF drive section 140 supplies a drive signal to the RF coil section 108 to transmit an RF pulse for exciting spins within the subject 1.

The RF coil section 108 is also connected with a data collecting section 150. The data collecting section 150 takes in signals received by the RF coil section 108 by sampling them, and collects them as digital data.

The table drive section 120, gradient drive section 130, RF drive section 140 and data collecting section 150 are connected with a control section 160. The control section 160 controls these sections 120, 130, 140 and 150 to carry out imaging.

The control section 160 is made up using a computer, for example. The control section 160 comprises a memory. The memory stores a program and several kinds of data for use by the control section 160. The function of the control section 160 is implemented by the computer executing the program stored in the memory.

The data collecting section 150 is connected on its output side to a data processing section 170. Data collected by the data collecting section 150 are input to the data processing section 170. The data processing section 170 is made up using a computer, for example. The data processing section 170 comprises a memory. The memory stores a program and several kinds of data for use by the data processing section 170.

The data processing section 170 is connected to the control section 160. The data processing section 170 is above the control section 160 and controls it. The function of the present apparatus is implemented by the data processing section 170 executing the program stored in the memory.

The data processing section 170 stores the data collected by the data collecting section 150 into the memory. A data space is established in the memory. The data space constitutes a Fourier space. The Fourier space is sometimes referred to as k-space. The data processing section 170 performs inverse Fourier transformation on the data in the k-space to reconstruct an image of the subject 1.

The data processing section 170 is connected with a display section 180 and an operating section 190. The display section 180 comprises a graphic display, etc. The operating section 190 comprises a keyboard provided with a pointing device, etc.

The display section 180 displays a reconstructed image output from the data processing section 170, and several kinds of information. The operating section 190 is operated by a user to input several kinds of commands, information and so forth to the data processing section 170. The user is capable of interactively operating the present apparatus via the display section 180 and operating section 190.

Figure 2:
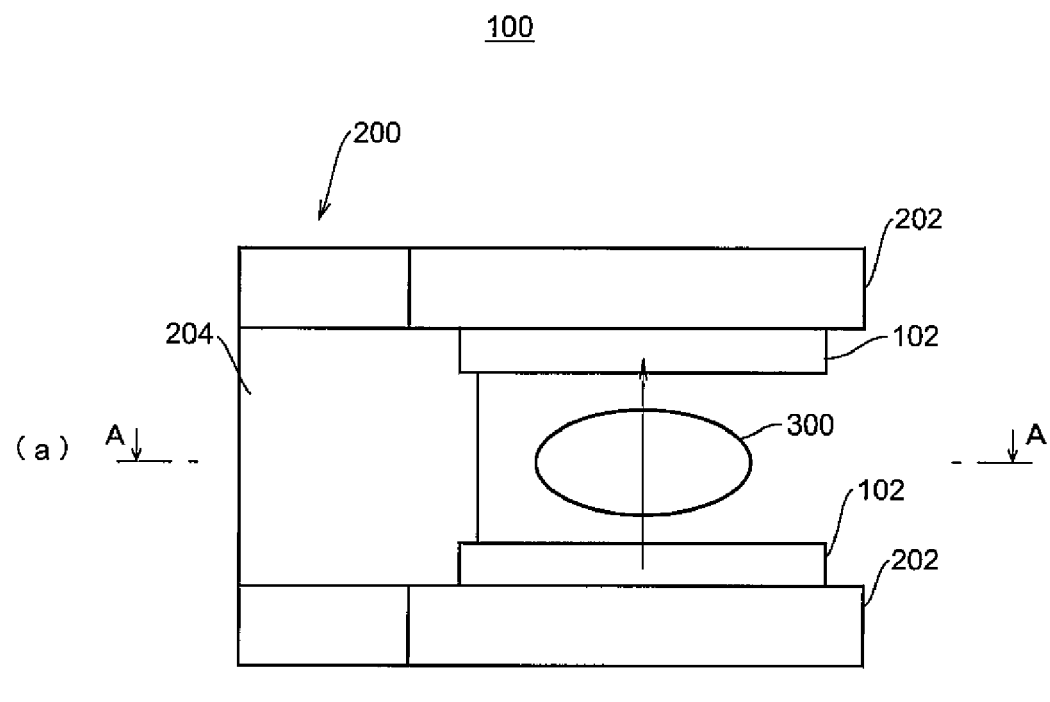
FIG. 2(a) and FIG. 2(b) show configurations of a magnetic field generating apparatus.
Figure 2:
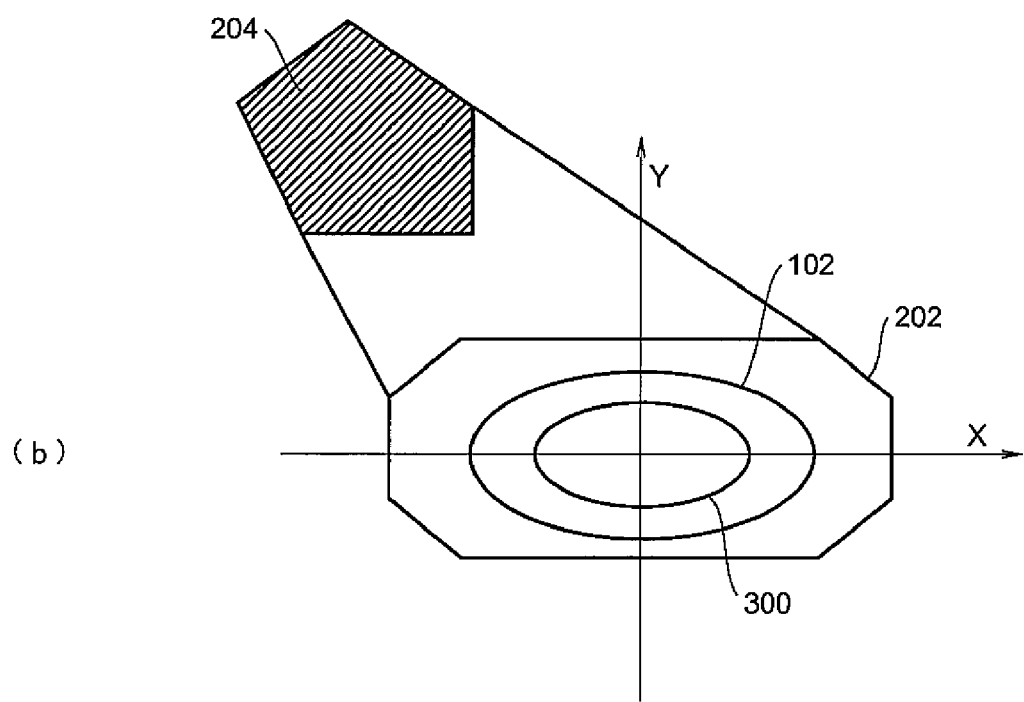

FIG. 2 schematically shows the configuration of an example of the magnetic field generating apparatus 100. In FIG. 2, (a) represents a front elevation view, and (b) represents a cross-sectional view taken along a line A-A. The magnetic field generating apparatus 100 is an example of the best mode for carrying out the invention. The configuration of the magnetic field generating apparatus 100 represents an example of the best mode for carrying out the invention of the magnetic field generating apparatus.

As shown in FIG. 2, the magnetic field generating apparatus 100 comprises a pair of magnets 102 supported by a yoke 200. The magnet 102 is an example of the magnet of the invention. The magnet 102 has a magnetic pole surface of a generally elliptical shape.

The yoke 200 is provided for forming a return path for the pair of magnets 102. The yoke 200 is formed generally in a C shape of a pair of planar magnetic elements 202 for supporting the pair of magnets, and a vertical columnar magnetic element 204 with each end joined to respective one of the pair of the planar magnetic elements 202, positioned in an obliquely rear direction. The planar magnetic elements 202 and columnar magnetic element 204 are made of a ferromagnetic material such as soft iron, for example.

The pair of magnets 102 are supported by the pair of planar magnetic elements 202 in parallel and concentrically such that their respective magnetic poles with mutually opposite polarities are disposed to face each other at a predetermined distance. A vertical magnetic field is thus generated between the magnetic poles. In the following description, the direction of the magnetic field is defined as Z direction. The direction from the front of the magnetic field generating apparatus 100 is defined as Y direction, and a lateral direction is defined as X direction.

The vertical magnetic field has a region of homogeneous magnetic field intensity 300. The region of homogeneous magnetic field intensity 300 will be sometimes referred to simply as homogeneous region 300 hereinbelow. The shape of the homogeneous region 300 is ellipsoidal. That is, the dimensions of the homogeneous region 300 are different in the three directions X, Y and Z.

Figure 3:
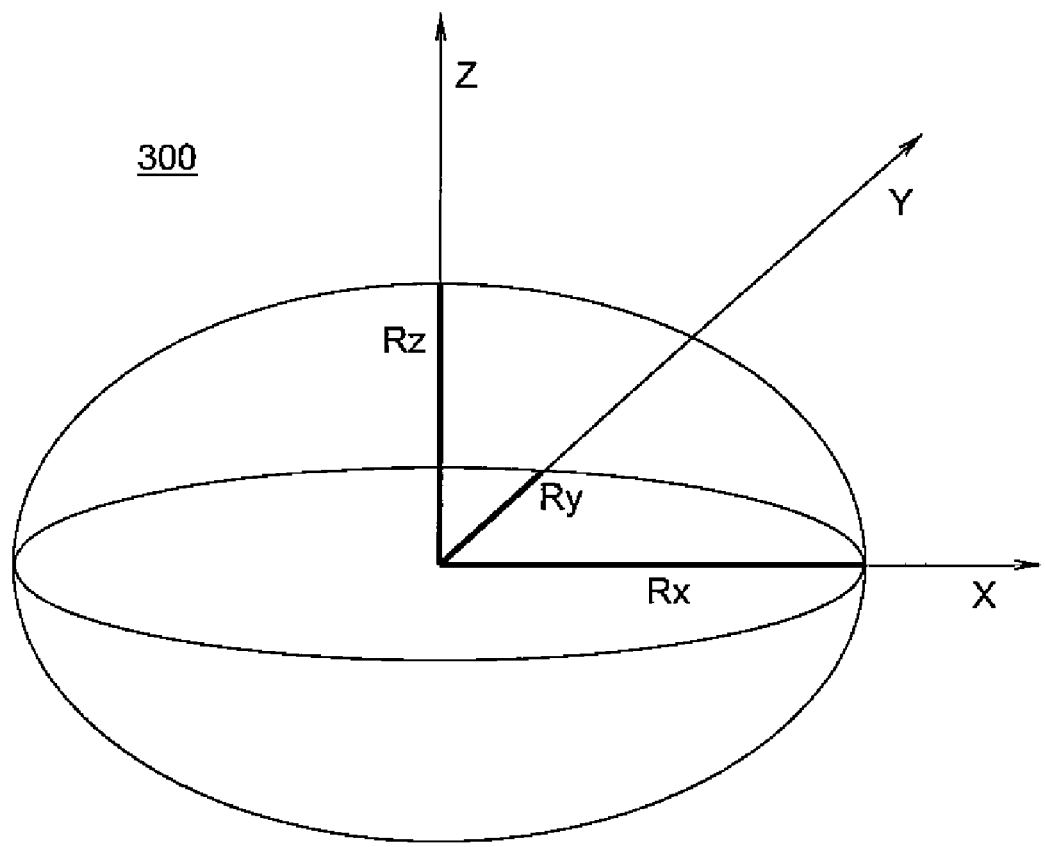
FIG. 3 shows a region of homogeneous magnetic field intensity.

As shown in FIG. 3, radii of the ellipsoid in the three directions are represented as Rz, Ry and Rz, and then, these values are all different and an inequality is represented as Rx>Rz>Ry. Actual values are, for example, Rx=20 cm, Rz=15 cm, and Ry=10 cm.

The magnetic field having such an ellipsoidal homogeneous region 300 can be generated by a magnet with a smaller magnetic pole surface area than that for a spherical homogeneous region with radii Rx, Ry and Rz in three directions of 20 cm. The yoke can also be made smaller commensurately with the smaller size of the magnet. Thus, the magnetic field generating apparatus 100 can be manufactured at low cost. Alternatively, if a cost as much as that for the conventional magnetic Field generating apparatus is affordable, a magnetic field generating apparatus with higher magnetic field intensity can be manufactured using a stronger magnet.

50% or more of imaging procedures by MRI are applied to the head, 20-30% to the spine, 10% to the extremities, and the balance to the abdomen. That is, imaging procedures on the head, spine and extremities account for 90% or more, and those on the abdomen account for only 10% or less.

Figure 4:
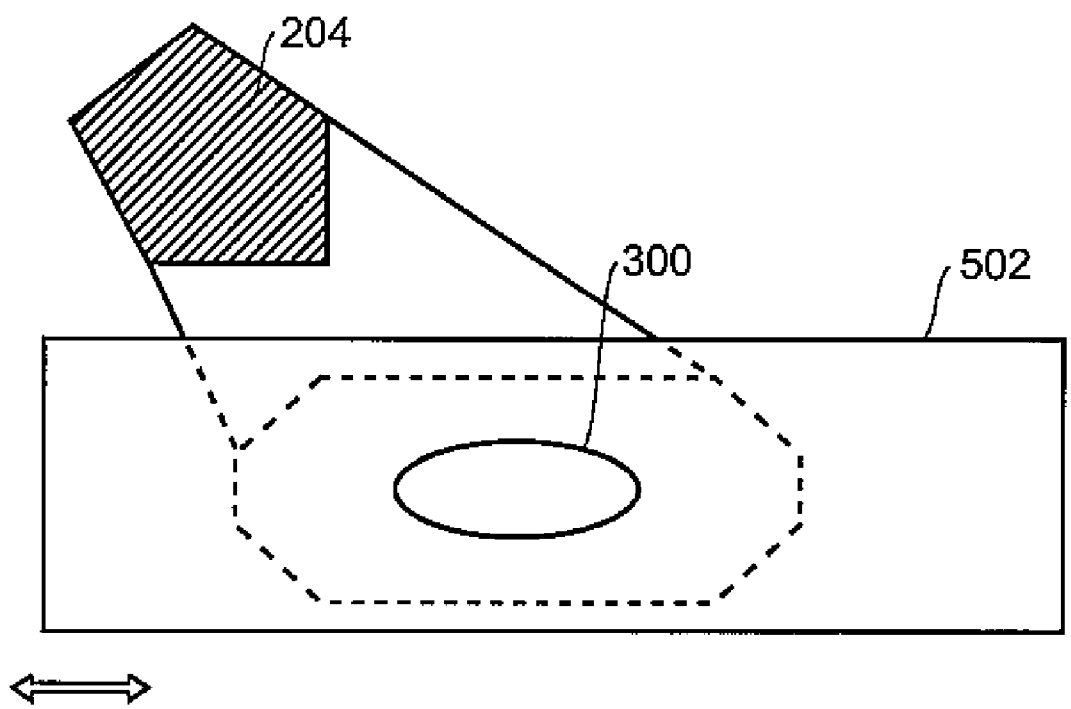
FIG. 4 shows the relationship between the magnetic Field generating apparatus and cradle in imaging.

FIG. 4 shows a case in which the head, spine and extremities are to be imaged. As shown in FIG. 4, the cradle 502 is positioned to align the body axis of the subject laid thereon with the X direction of the homogeneous region 300. It should be noted that the cradle 502 is a movable top plate provided on the table 500, and the position of the cradle 502 is changeable in the X direction. Since the columnar magnetic element 204 of the magnetic field generating apparatus 100 is positioned in the obliquely rear direction, the cradle 502 can be unrestrictedly moved in the X direction.

When the cradle 502 is thus positioned, the dimensions of the homogeneous region 300 are 40 cm in the body axis direction, 30 cm in the body thickness direction, and 20 cm in the body width direction. The homogeneous region having such dimensions is sufficient to perform axial, sagittal and coronal imaging on the head, spine and extremities. That is, 90% or more of imaging procedures can be achieved in such a position.

Figure 5:
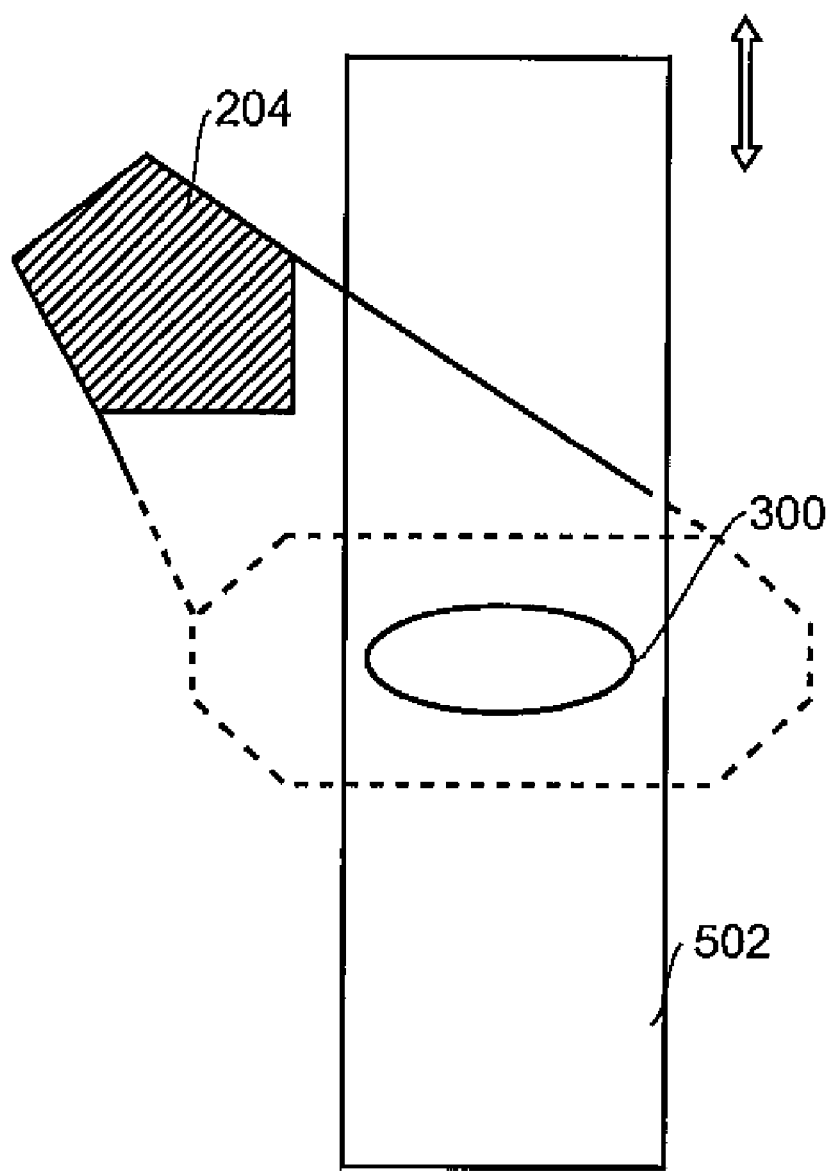
FIG. 5 is shows the relationship between the magnetic field generating apparatus and cradle in imaging.

FIG. 5 shows a case in which the abdomen is to be imaged. As shown in FIG. 5, the cradle 502 is positioned to align the body axis of the subject laid thereon with the Y direction of the homogeneous region 300. The position of the cradle 502 is changeable in the Y direction. Since the columnar magnetic element 204 of the magnetic field generating apparatus 100 is positioned in the obliquely rear direction, the cradle 502 can be unrestrictedly moved in the Y direction.

When the cradle 502 is thus positioned, the dimensions of the homogeneous region 300 are 40 cm in the body width direction, 30 cm in the body thickness direction, and 20 cm in the body axis direction. The homogeneous region having such dimensions is sufficient to perform axial imaging on the abdomen. That is, the remaining imaging procedures by MRI less than 10% can be achieved in such a position. Imaging procedures on all regions can be thus achieved.

Figure 6:
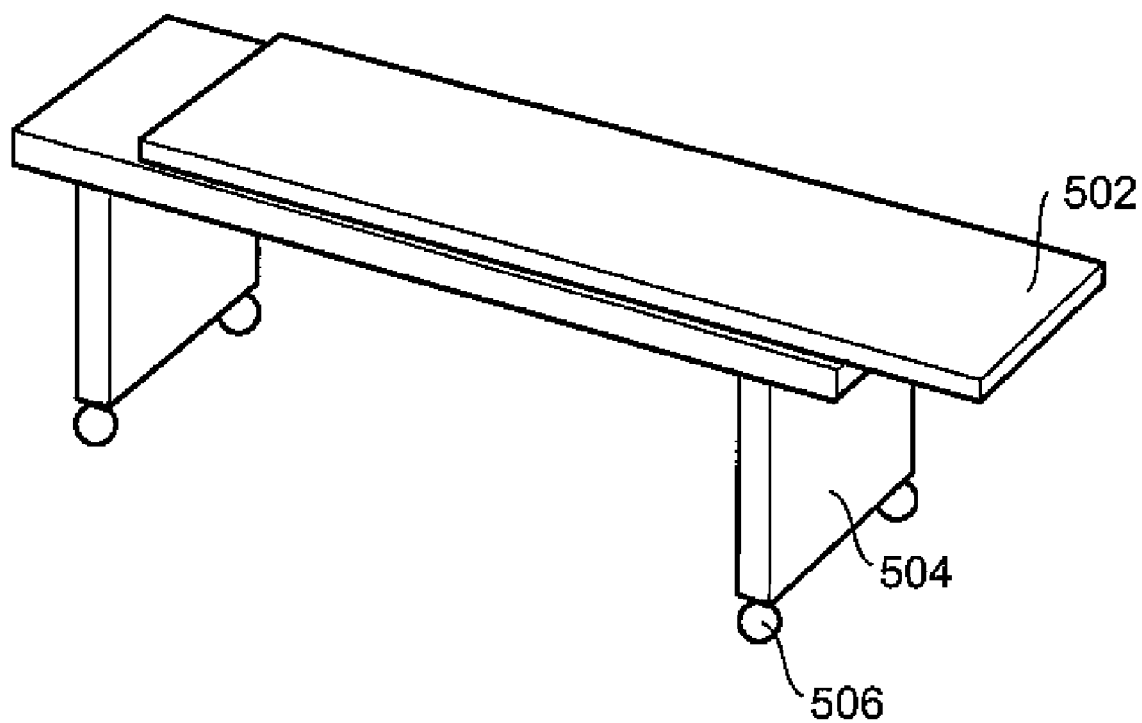
FIG. 6 shows a configuration of the table.

FIG. 6 shows a configuration of the table 500. As shown in FIG. 6, the table 500 is comprised of the cradle 502 and a support base 504 for supporting the cradle 502 movable in the longitudinal direction. The support base 504 is open in its lower portion so as to straddle the lower structure of the magnetic field generating apparatus 100, and the support base 504 has wheels 506 as well.

Figure 7:
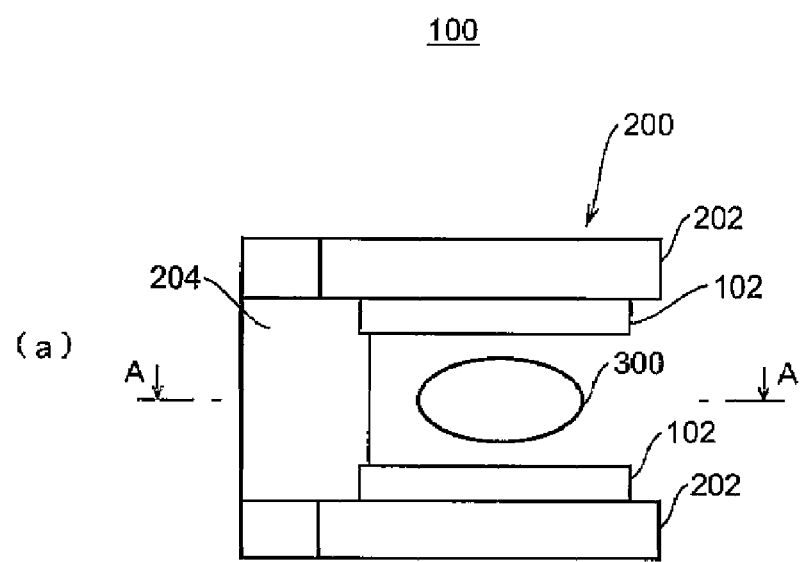
FIG. 7(a) and FIG. 7(b) show configurations of the magnetic field generating apparatus.
Figure 7:
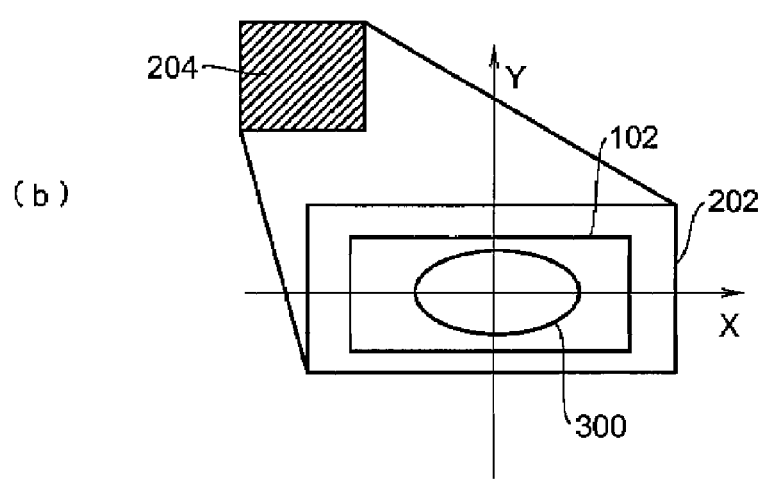

FIG. 7 schematically shows the configuration of another example of the magnetic field generating apparatus 100. In FIG. 7, (a) represents a front elevation view, and (b) represents a cross-sectional view taken along a line A-A. The magnetic field generating apparatus 100 is an example of the best mode for carrying out the invention. The configuration of the magnetic field generating apparatus 100 represents an example of the best mode for carrying out the invention of the magnetic field generating apparatus.

As shown in FIG. 7, the magnetic field generating apparatus 100 comprises a pair of magnets 102 supported by a yoke 200. The magnet 102 is an example of the magnet of the invention. The magnet 102 has a magnetic pole surface of a generally rectangular shape. The shape of the homogeneous region 300 of the vertical magnetic field generated by the magnetic field generating apparatus is again ellipsoidal. It should be noted that the shape of the magnetic pole surface of the magnet 102 is not limited to an elliptical or rectangular shape, and any other appropriate shape is applicable.

Figure 8:
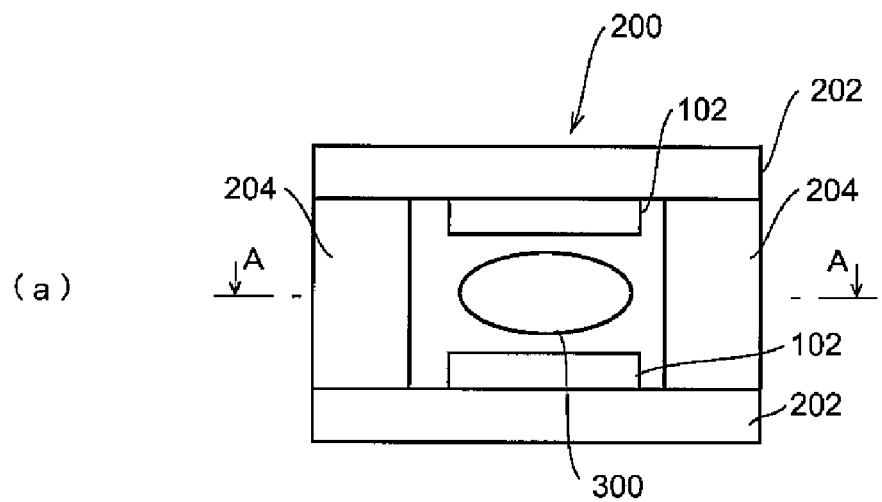
FIG. 8(a) and FIG. 8(b) show configurations of the magnetic field generating apparatus.
Figure 8:
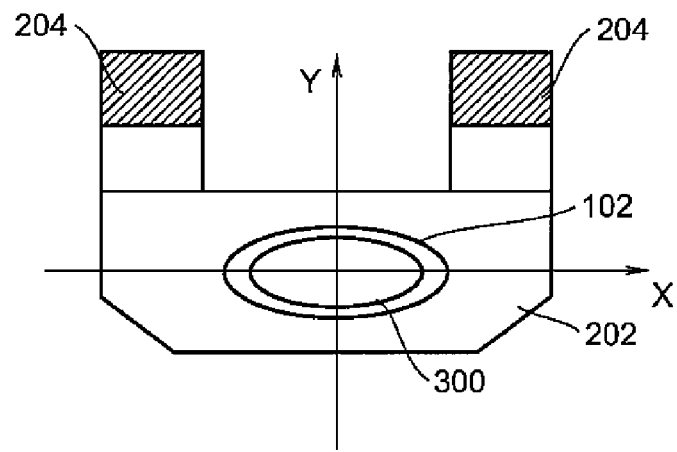

FIG. 8 schematically shows the configuration of an example of the magnetic field generating apparatus 100. In FIG. 8, (a) represents a front elevation view, and (b) represents a cross-sectional view taken along a line A-A. The magnetic field generating apparatus 100 is an example of the best mode for carrying out the invention. The configuration of the magnetic field generating apparatus 100 represents an example of the best mode for carrying out the invention of the magnetic field generating apparatus.

As shown in FIG. 8, the magnetic field generating apparatus 100 comprises a pair of magnets 102 supported by a yoke 200. The magnet 102 is an example of the magnet of the invention. The magnet 102 has a magnetic pole surface of a generally elliptical shape.

The yoke 200 is provided for forming a return path for the pair of magnets 102. The yoke 200 is made up with a pair of planar magnetic elements 202 for supporting the pair of magnets, and two vertical columnar magnetic elements 204 with each end joined to respective one of the pair of the planar magnetic elements 202, provided at two positions in an obliquely rear direction. Since the two columnar magnetic elements 204 are employed, supportiveness for the planar magnetic elements 202 is improved. The planar magnetic elements 202 and columnar magnetic element 204 are made of a ferromagnetic material such as soft iron, for example. The pair of magnets 102 form a magnetic field whose homogeneous region 300 has an ellipsoidal shape elongated in the X direction.

Figure 9:
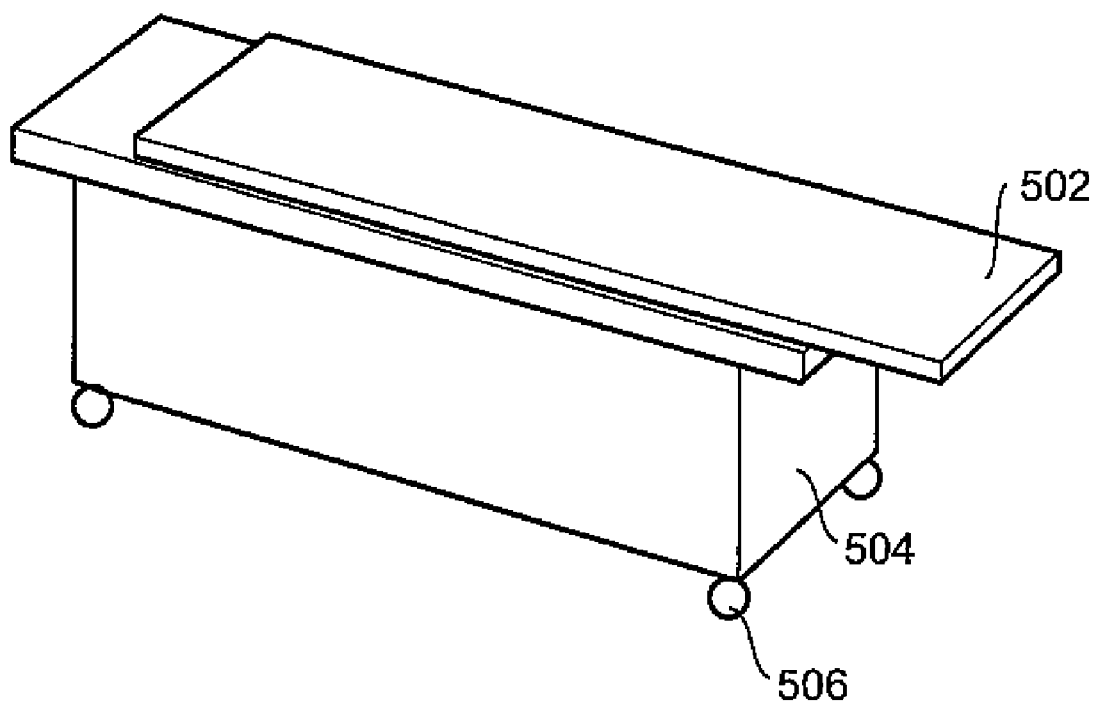
FIG. 9 shows a configuration of the table.

FIG. 9 shows a configuration of the table 500 adapted for such a magnetic field generating apparatus 100. As shown in FIG. 9, the table 500 is comprised of a cradle 502 and a support base 504 for supporting the cradle 502 movable in the longitudinal direction. The support base 504 has wheels 506.

Figure 10:
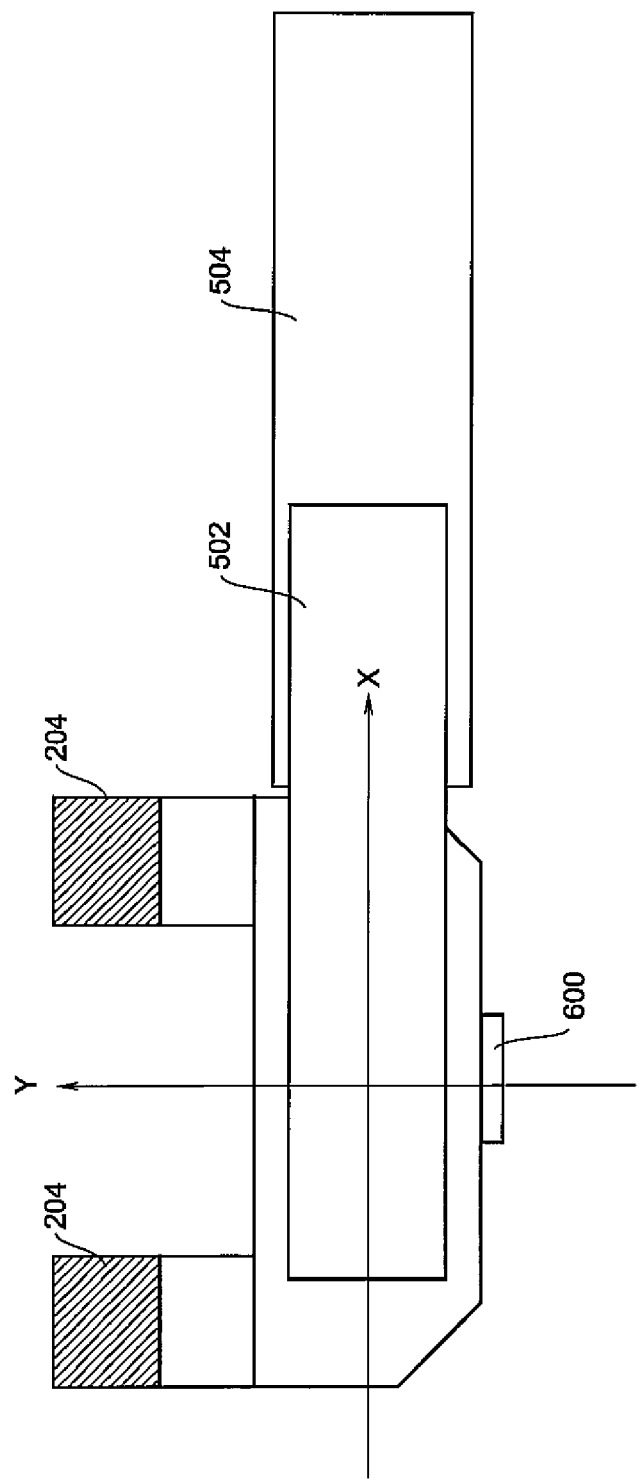
FIG. 10 shows the relationship between the magnetic field generating apparatus and cradle in imaging.

FIG. 10 shows a case in which the head, spine and extremities are to be imaged using such magnetic field generating apparatus 100 and table 500. As shown in FIG. 10, the table 500 is disposed to have its support base 504 abutting against the lateral side of the magnetic field generating apparatus 100, and the longitudinal direction of the cradle 502 aligned with the X direction of the homogeneous region 300. The position of the cradle 502 is changeable in the X direction. Since the two columnar magnetic elements 204 of the magnetic field generating apparatus 100 are positioned in the obliquely rear direction, the cradle 502 can be unrestrictedly moved in the X direction.

Although hidden in FIG. 10 (visible in FIG. 11), an electric connector 600 is provided at the position where the support base 504 abuts against the magnetic field generating apparatus 100, and a control signal for controlling movement of the cradle 502 is supplied from the magnetic field generating apparatus 100 to the table 500.

Figure 11:
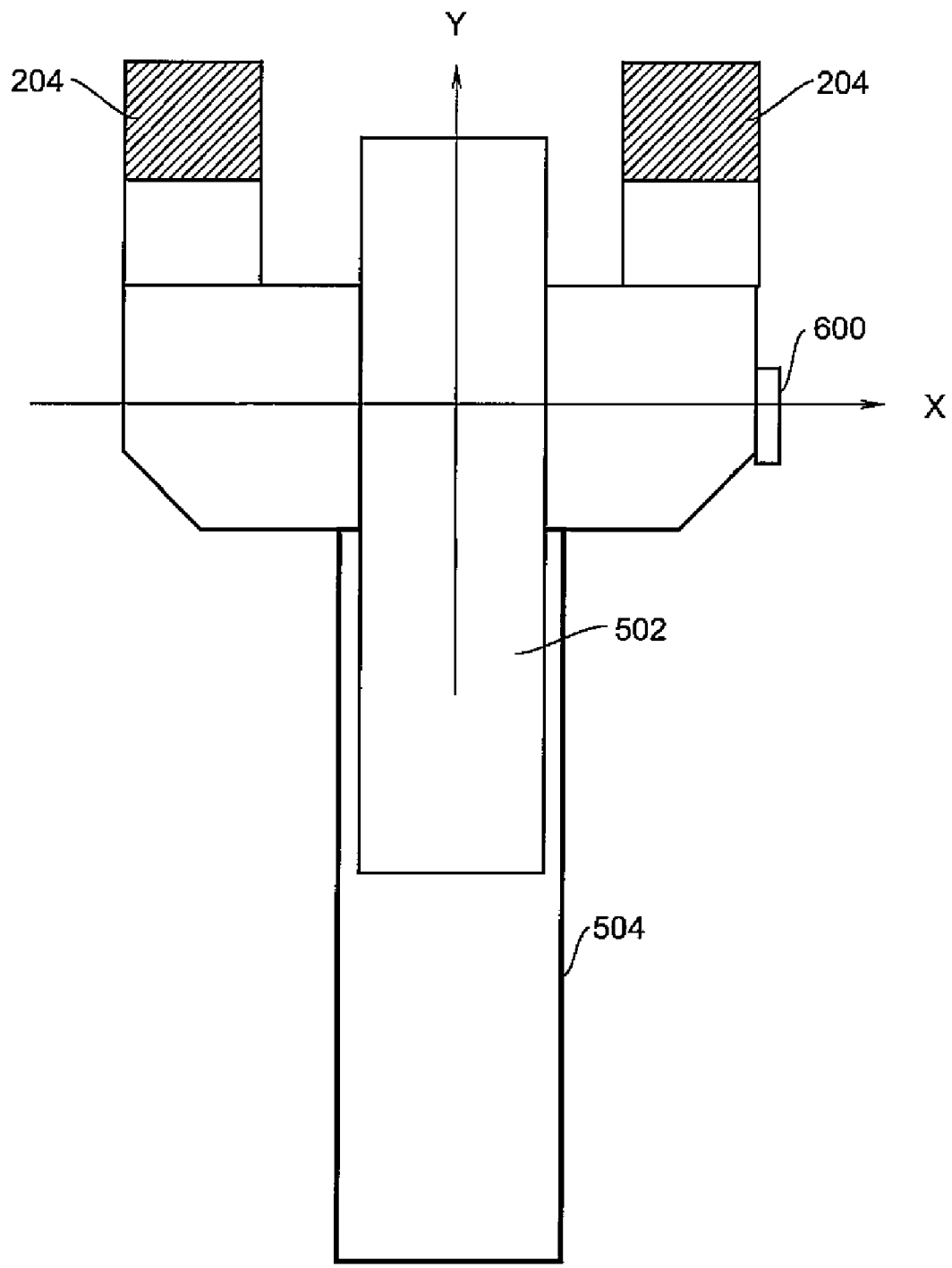
FIG. 11 shows the relationship between the magnetic field generating apparatus and cradle in imaging.

FIG. 11 shows a case in which the abdomen is to be imaged. As shown in FIG. 11, the table 500 is disposed to have its support base 504 abutting against the front side of the magnetic field generating apparatus 100, and the longitudinal direction of the cradle 502 aligned with the Y direction of the homogeneous region 300. The position of the cradle 502 is changeable in the Y direction. Since the columnar magnetic elements 204 of the magnetic field generating apparatus 100 are positioned in the obliquely rear direction, the cradle 502 can be unrestrictedly moved in the Y direction.

Although hidden in FIG. 11 (visible in FIG. 10), an electric connector 600 is provided at the position where the support base 504 abuts against the magnetic field generating apparatus 100, and a control signal for controlling movement of the cradle 502 is supplied from the magnetic field generating apparatus 100 to the table 500.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic field generating apparatus for generating a magnetic field in a first direction, comprising:
    a pair of magnets having respective magnetic poles with mutually opposite polarities disposed to face each other in the first direction, for generating a static magnetic field having different dimensions of its region of homogeneous magnetic field intensity in two mutually orthogonal directions in a plane that is perpendicular to the first direction;
    a pair of planar magnetic elements, each element supporting respective one of said pair of the magnets; and
    a columnar magnetic element lying in a direction different from said two mutually orthogonal directions, each end of which is joined to respective one of said pair of the planar magnetic elements.

2. The magnetic field generating apparatus of claim 1, wherein said region of homogeneous magnetic field intensity has a cross section of an elliptical shape.

3. The magnetic field generating apparatus of claim 1, wherein a magnetic pole surface of each one of said pair of the magnets has different dimensions in said two mutually orthogonal directions.

4. The magnetic field generating apparatus of claim 3, wherein the magnetic pole surfaces of said pair of the magnets have an elliptical shape.

5. The magnetic field generating apparatus of claim 3, wherein the magnetic pole surfaces of said pair of the magnets have a rectangular shape.

6. The magnetic field generating apparatus of claim 1, wherein the number of said columnar magnetic elements is two.

7. An MRI apparatus for reconstructing an image based on magnetic resonance signals collected by applying a static magnetic field, a gradient magnetic field, and an RF magnetic field to a subject, comprising:
    a pair of magnets having respective magnetic poles with mutually opposite polarities disposed to face each other in a first direction, for generating a static magnetic field having different dimensions of its region of homogeneous magnetic field intensity in two mutually orthogonal directions in a plane that is perpendicular to the first direction;
    a pair of planar magnetic elements, each element supporting respective one of said pair of the magnets;
    a columnar magnetic element lying in a direction different from said two mutually orthogonal directions, each end of which is joined to respective one of said pair of the planar magnetic elements;
    a cradle movable in one axis direction with the subject laid thereon; and
    a table for supporting said cradle, capable of aligning the direction of its movement axis with any of said two mutually orthogonal directions.

8. The MRI apparatus of claim 7, wherein said region of homogeneous magnetic field intensity has a cross section of an elliptical shape.

9. The MRI apparatus of claim 7, wherein a magnetic pole surface of each one of said pair of the magnets has different dimensions in said two mutually orthogonal directions.

10. The MRI apparatus of claim 9, wherein the magnetic pole surfaces of said pair of the magnets have an elliptical shape.

11. The MRI apparatus of claim 9, wherein the magnetic pole surfaces of said pair of the magnets have a rectangular shape.

12. The MRI apparatus of claim 7, wherein the number of said columnar magnetic elements is two.

13. The magnetic field generating apparatus of claim 1, wherein the apparatus is configured for use in an MRI apparatus.

14. A method for assembling a magnetic field generating apparatus for generating a magnetic field in a first direction, said method comprising:
    disposing a pair of magnets having respective magnetic poles with mutually opposite polarities to face each other in a first direction, the magnets for generating a static magnetic field having different dimensions of its region of homogeneous magnetic field intensity in two mutually orthogonal directions in a plane that is perpendicular to the first direction;
    supporting each of the pair of magnets with a planar magnetic element;
    positioning a columnar magnetic element in a direction different from the two mutually orthogonal directions; and
    joining each end of the columnar magnetic element with one of the planar magnetic elements.

15. The method of claim 14, wherein said disposing a pair of magnets further comprises disposing a pair of magnets to generate a homogeneous magnetic field intensity that has a cross section of an elliptical shape.

16. The method of claim 14, wherein said disposing a pair of magnets further comprises disposing a pair of magnets such that each magnet has a magnetic pole surface with different dimensions in the two mutually orthogonal directions.

17. The method of claim 16, wherein said disposing a pair of magnets further comprises disposing a pair of magnets having magnetic pole surfaces with an elliptical shape.

18. The method of claim 16, wherein said disposing a pair of magnets further comprises disposing a pair of magnets having magnetic pole surfaces with a rectangular shape.

19. The method of claim 14, wherein positioning a columnar magnetic element further comprises positioning two columnar magnetic elements.

20. The method of claim 14, further comprising configuring the apparatus for use with an MRI apparatus.

* * * * *